(12) United States Patent
Kwon et al.

(10) Patent No.: US 12,444,620 B2
(45) Date of Patent: Oct. 14, 2025

(54) SEMICONDUCTOR DEVICE AND METHOD OF FORMING SiP MODULE ABSENT SUBSTRATE

(71) Applicant: STATS ChipPAC Pte. Ltd., Singapore (SG)

(72) Inventors: JiEun Kwon, Incheon (KR); JiSik Moon, Incheon (KR); KiCheol Lee, Incheon (KR); BoLee Lim, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 671 days.

(21) Appl. No.: 17/661,747

(22) Filed: May 2, 2022

(65) Prior Publication Data

US 2023/0352316 A1 Nov. 2, 2023

(51) Int. Cl.
*H01L 21/56* (2006.01)
*H01L 23/00* (2006.01)
*H01L 23/31* (2006.01)

(52) U.S. Cl.
CPC .......... *H01L 21/561* (2013.01); *H01L 21/568* (2013.01); *H01L 23/3107* (2013.01);
(Continued)

(58) Field of Classification Search
CPC . H01L 21/561; H01L 21/568; H01L 23/3107; H01L 24/05; H01L 24/13; H01L 24/96; H01L 2224/05611; H01L 2224/05624; H01L 2224/05639; H01L 2224/05644; H01L 2224/05647; H01L 2224/05655; H01L 2224/13111; H01L 2224/13113; H01L 2224/13116; H01L 2224/13124; H01L 2224/13139; H01L 2224/13144; H01L 2224/13147; H01L 2224/13155; H01L 24/95; H01L 25/18; H01L 25/0655; H01L 2221/68345;
(Continued)

(56) References Cited

U.S. PATENT DOCUMENTS 5,844,315 A * 12/1998 Melton ................. H01L 21/568
257/E23.032
6,001,671 A 12/1999 Fjelstad
(Continued)

*Primary Examiner* — Raj R Gupta
(74) *Attorney, Agent, or Firm* — Robert D. Atkins; PATENT LAW GROUP: Atkins and Associates, P.C.

(57) ABSTRACT

A semiconductor device has a sacrificial substrate and an electrical component disposed over the sacrificial substrate. A bump stop layer is formed within the sacrificial substrate. At least a portion of the bump or terminal of the electrical component is embedded into the sacrificial substrate to contact the bump stop layer. An encapsulant is deposited over the electrical component and sacrificial substrate. A channel is formed through the encapsulant and partially into the sacrificial substrate. The sacrificial substrate is removed to leave a bump or terminal of the electrical component extending out from the encapsulant. A thickness of the semiconductor device is determined by a thickness of the encapsulant and bump extending out from the encapsulant. A portion of the encapsulant can be removed to reduce the thickness of the semiconductor device. A conductive paste can be deposited over the bump or terminal extending out from the encapsulant.

28 Claims, 17 Drawing Sheets

(52) U.S. Cl.
CPC .............. *H01L 24/05* (2013.01); *H01L 24/13* (2013.01); *H01L 24/96* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01)

(58) Field of Classification Search
CPC . H01L 21/6835; H01L 21/56; H01L 23/3114; H01L 23/293; H01L 2224/95001; H01L 24/14; H01L 24/12; H10D 80/215
See application file for complete search history.

(56) References Cited

U.S. PATENT DOCUMENTS

| | | |
|---|---|---|
| 8,048,781 B2 | 11/2011 | How |
| 9,123,733 B1 | 9/2015 | Huang et al. |
| 9,711,492 B2 | 7/2017 | Albers et al. |
| 10,418,341 B2 | 9/2019 | Jung et al. |
| 10,804,119 B2 | 10/2020 | Kim et al. |
| 2009/0230532 A1* | 9/2009 | Ko ................... H01L 25/03 257/E23.024 |
| 2016/0163675 A1* | 6/2016 | Kim ................... H01L 24/97 257/737 |
| 2016/0276258 A1* | 9/2016 | Lin ................... H01L 21/78 |
| 2019/0051614 A1* | 2/2019 | Dimaano, Jr. ...... H01L 23/3128 |

\* cited by examiner

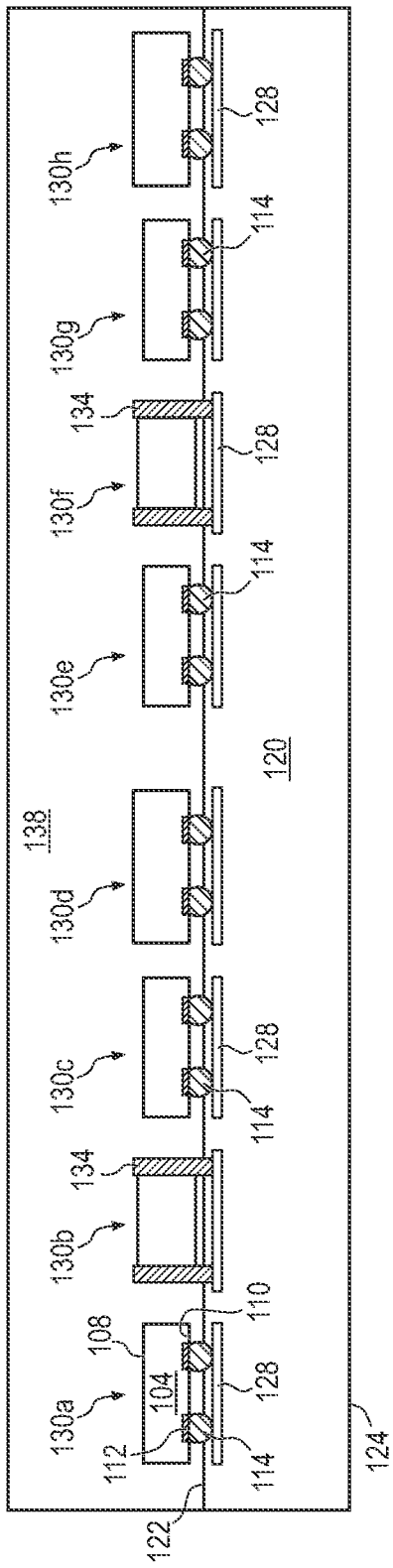
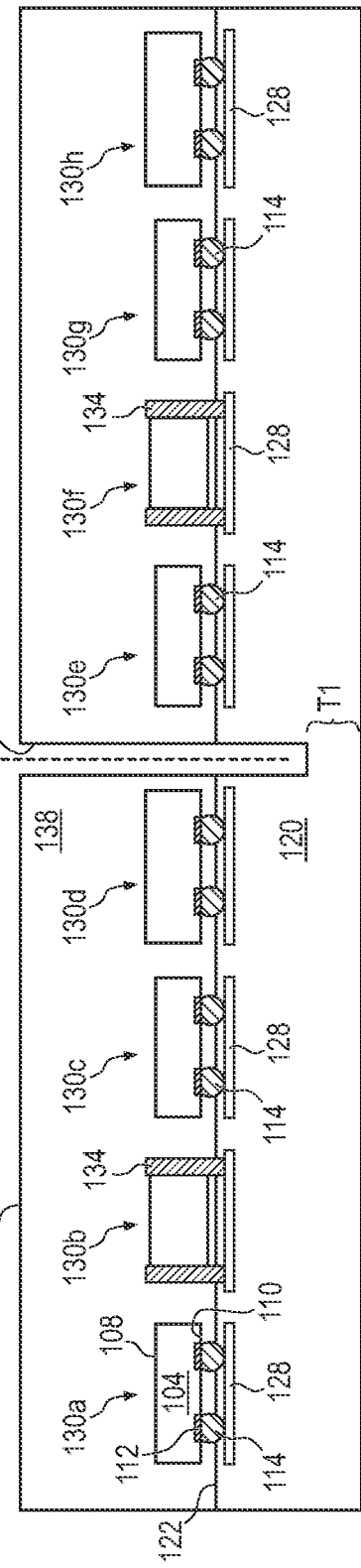
FIG. 2d
FIG. 2e

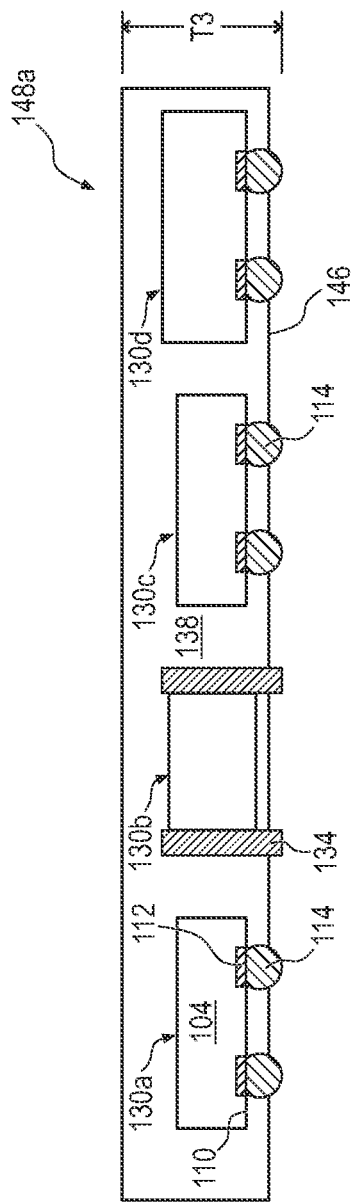
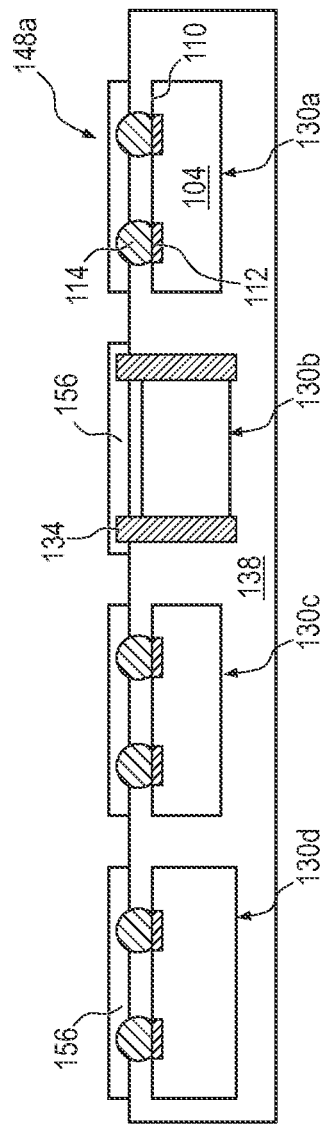
FIG. 2j
FIG. 2k

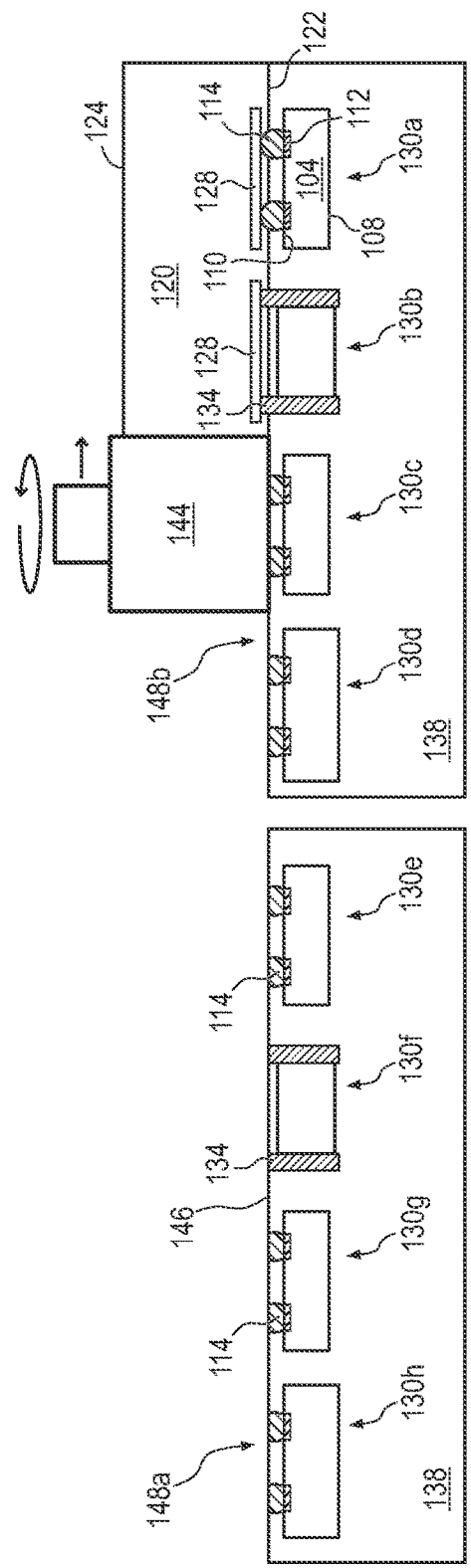
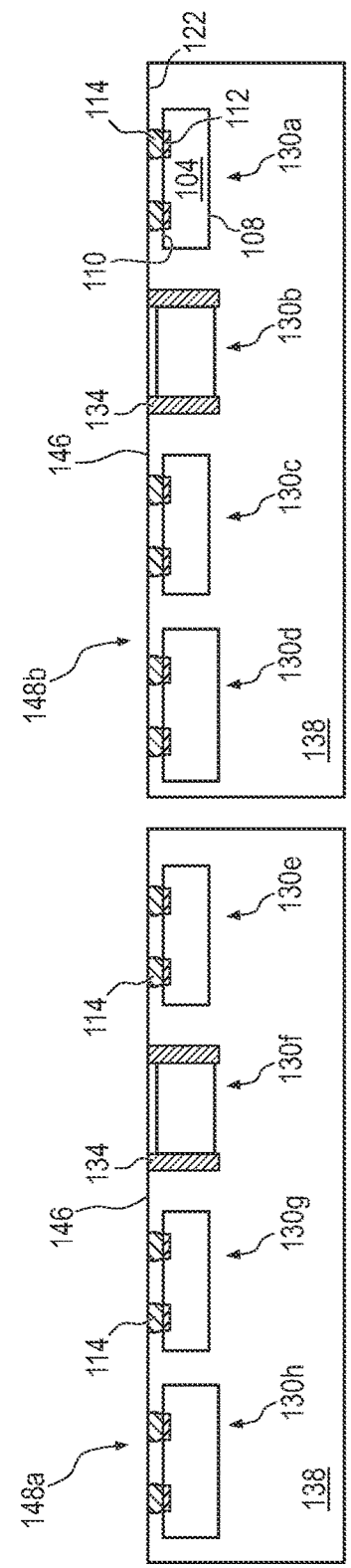
FIG. 8a
FIG. 8b

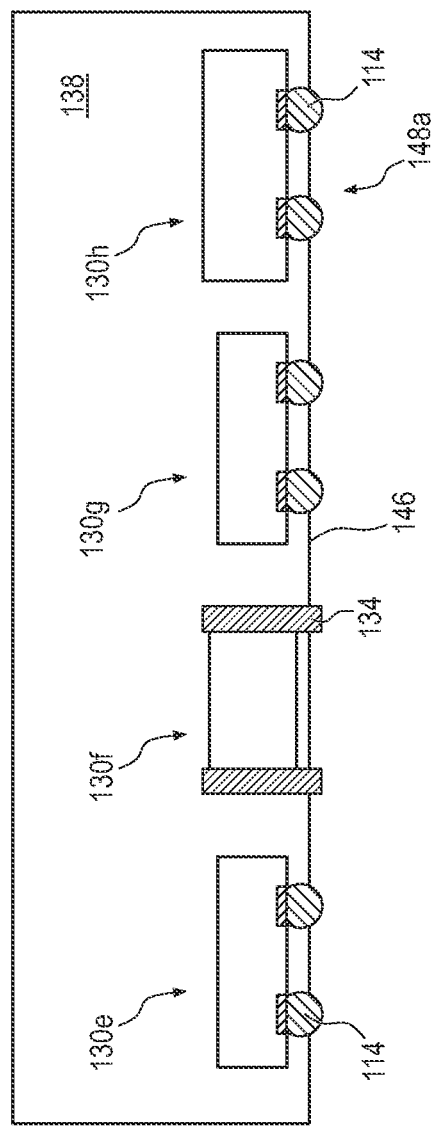

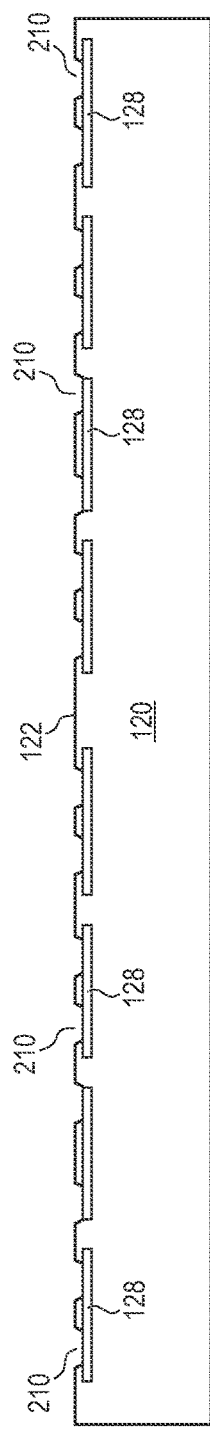
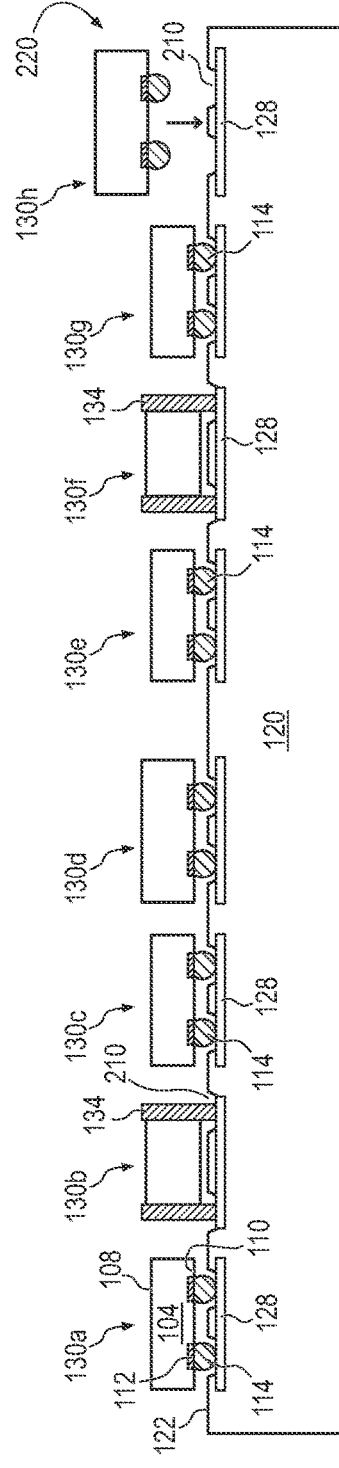
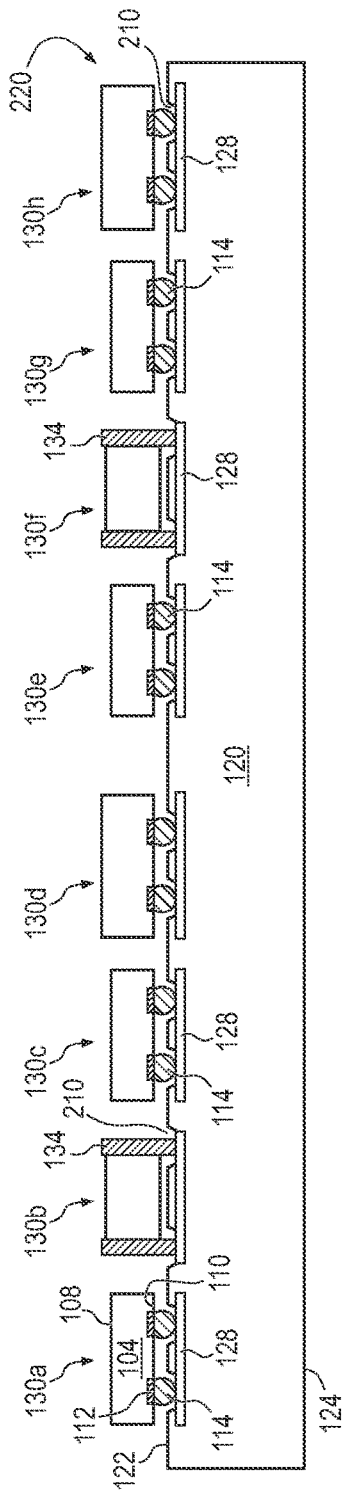
FIG. 9a
FIG. 9b
FIG. 9c

SEMICONDUCTOR DEVICE AND METHOD OF FORMING SiP MODULE ABSENT SUBSTRATE

FIELD OF THE INVENTION

The present invention relates in general to semiconductor devices and, more particularly, to a semiconductor and method of forming a SiP module absent a substrate.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Multiple semiconductor die, discrete semiconductor devices, and integrated passive devices (IPDs) can be integrated into a system in package (SiP) module for higher density in a small space and extended electrical functionality. Within the SiP module, semiconductor die and IPDs are mounted to a substrate for structural support and electrical interconnect. An encapsulant is deposited over the semiconductor die, discrete semiconductor devices, IPDs, and substrate. The overall height of the SiP module is determined by the combined height of the encapsulant and substrate. It would be preferable to reduce a height of the SiP module.

BRIEF DESCRIPTION OF THE DRAWINGS

FIGS. 2a-2k illustrate a process of forming an SiP module absent a substrate;

FIGS. 8a-8e illustrate another process of forming an SiP module absent a substrate;

FIGS. 9a-9c illustrate another process of forming an SiP module absent a substrate.

DETAILED DESCRIPTION OF THE DRAWINGS

The present invention is described in one or more embodiments in the following description with reference to the figures, in which numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
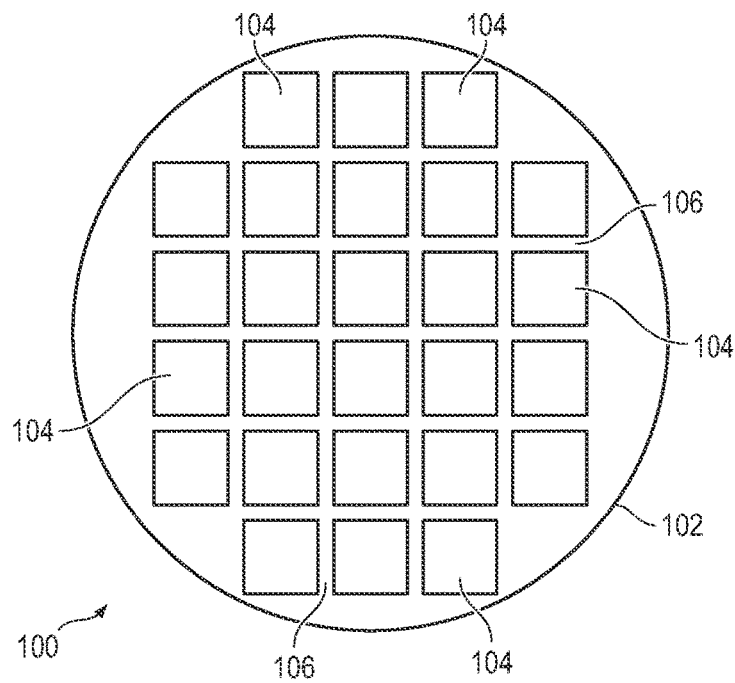
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
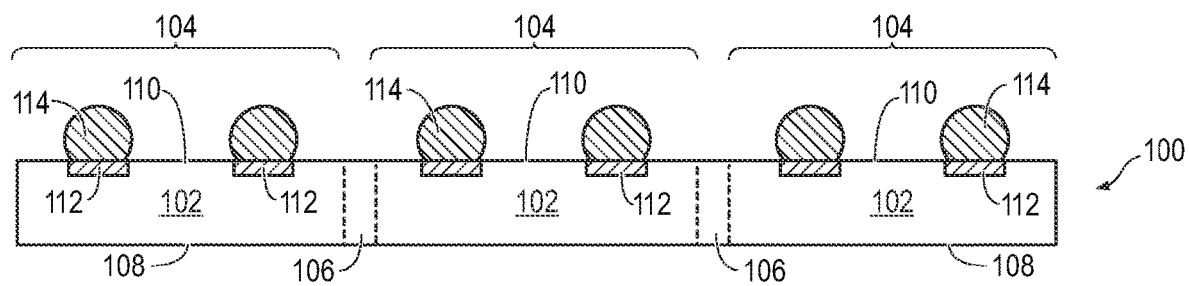

FIG. 1B shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
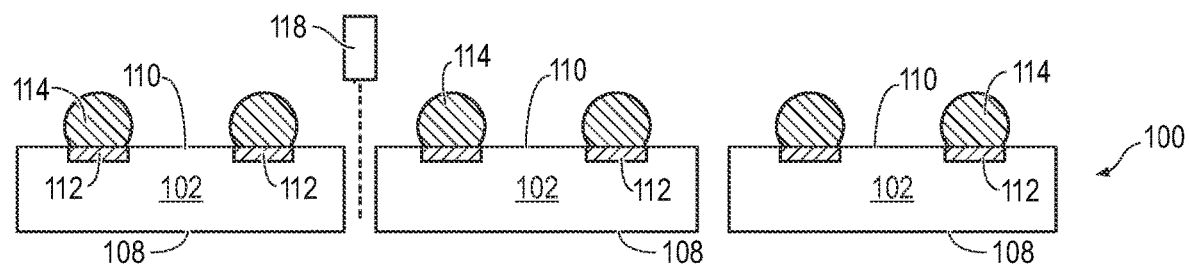

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die or unit (KGD/KGU) post singulation.

Figure 2A:
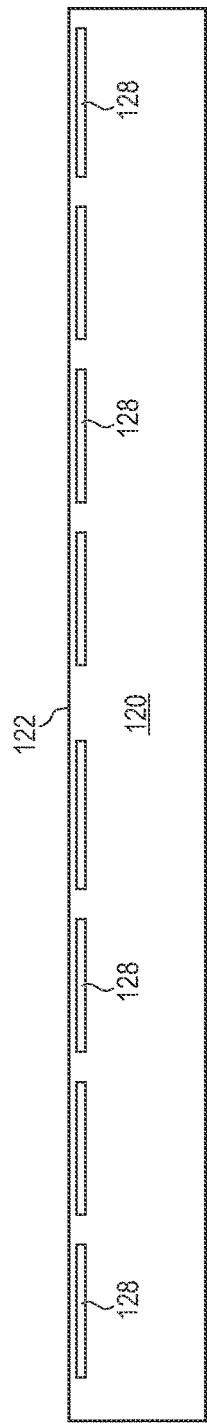

FIGS. 2a-2k illustrate a process of forming an SiP module absent a substrate. FIG. 2a shows a cross-sectional view of sacrificial substrate or carrier 120 including top major surface 122 and bottom major surface 124. Substrate 120 contains a sacrificial material that provides structural support and can be readily removed at a later step. The sacrificial base material can be plastic, polymer, beryllium oxide, glass, or other suitable low-cost, rigid material. In one embodiment, substrate 120 is made with one or more laminated layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics. A bump stop layer 128 is embedded within substrate 120, below surface 122.

Figure 3A:
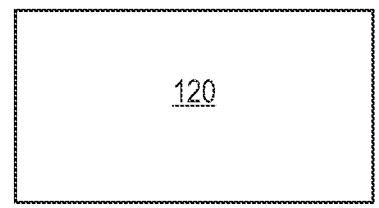
FIGS. 3a-3c illustrate a process of forming a sacrificial substrate with embedded bump stop layer.
Figure 3B:
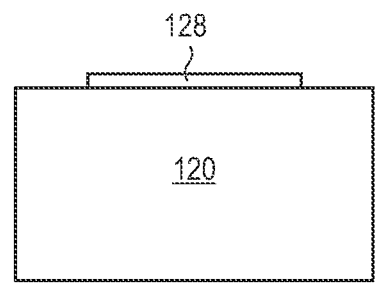
Figure 3C:
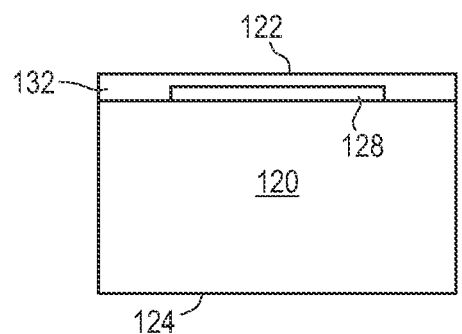

FIGS. 3a-3c illustrate further detail of forming bump stop layer 128. FIG. 3a shows a portion of substrate 120. Elements having a similar function are assigned the same reference number in the figures. In FIG. 3b, bump stop layer 128 is formed over substrate 120. Bump stop layer 128 can be a metal layer or other rigid material capable of stopping the penetration of conductive bumps 114, as described infra. In FIG. 3c, penetrable film layer 132 is formed over substrate 120 and bump stop layer 128 using PVD, CVD, printing, spin coating, spray coating, slit coating, rolling coating, lamination, or sintering. In one embodiment, penetrable film layer 132 is a polymer, epoxy, acryl-based B-stage material, or other similar material with penetrable properties. Penetrable film layer 132 has a thickness of 125 micrometers (μm). Alternatively, penetrable film layer 132 can be one or more layers of silicon dioxide (SiO2), silicon nitride (Si3N4), silicon oxynitride (SiON), tantalum pentoxide (Ta2O5), aluminum oxide (Al2O3), silicon dioxide (SiO2), silicon nitride (Si2n4), silicon oxynitride (SiON), tantalum pentoxide (Ta2O5), aluminum oxide (Al2O3), polyimide, benzocyclobutene (BCB), polybenzoxazoles (PBO), or other material having similar insulating and structural properties. Penetrable film layer 132 operates as a temporary penetrable substrate for attachment of electronic components. Penetrable film layer 132 is considered part of substrate 120 and the top surface of the penetrable film layer becomes major surface 122 of substrate 120.

Figure 2B:
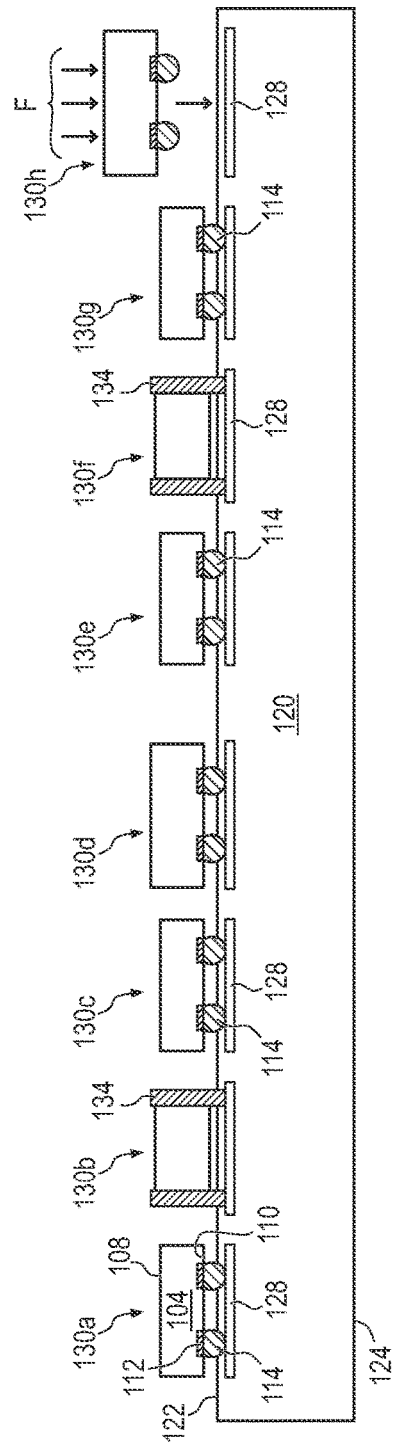

In FIG. 2b, a plurality of electrical components 130a-130h is mounted to surface 122 of substrate 120. Electrical components 130a-130h are each positioned over substrate 120 using a pick and place operation. For example, electrical component 130a and 130e can be semiconductor die 104 from FIG. 1c with active surface 110 and bumps 114 oriented toward surface 122 of substrate 120. Electrical components 130b and 130f can be discrete electrical devices, such as a transistor, diode, resistor, capacitor, and inductor. Electrical components 130b and 130f have terminals 134 for electrical interconnect. Electrical components 130c, 130d, 130g, and 130h can be made similar to semiconductor die 104 although possibly with a different form and function with bumps 114 oriented toward surface 122. Alternatively, electrical components 130a-130h can include other semiconductor die, semiconductor packages, and surface mount devices.

Figure 4:
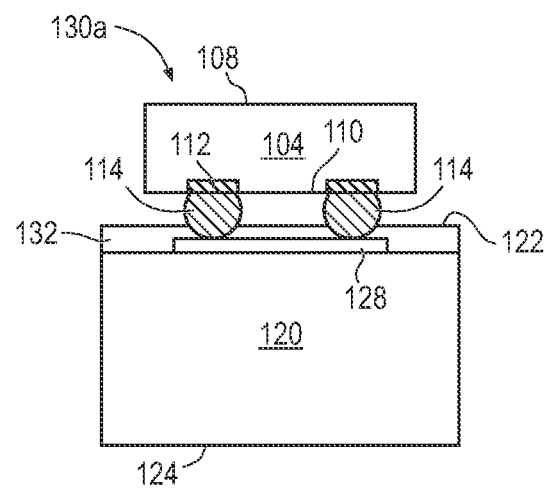
FIG. 4 illustrates an electrical component with bumps embedded in the sacrificial substrate down to the bump etch stop.

In particular, electrical components 130a-130h are disposed on surface 122 and then pressed into substrate 120 with force F so that bumps 114 and terminals 134 extend below the surface of the substrate to contact bump stop layer 128. As an example, FIG. 4 shows further detail of electric component 130a with bumps 114 extending into substrate 120. In this case, bumps 114 are pressed into substrate 120 and extend below surface 122, at least partially into penetrable film layer 132, and contact bump stop layer 128.

Figure 2C:
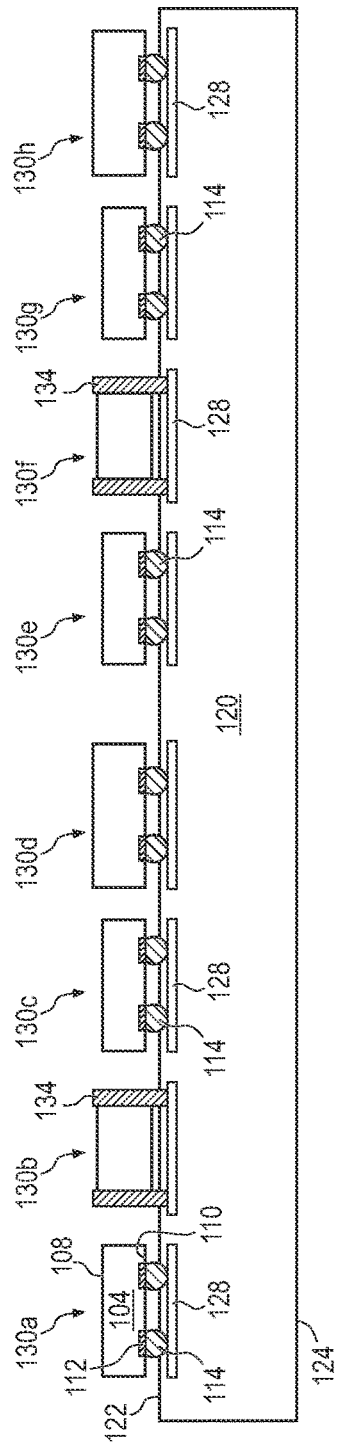

FIG. 2c shows electrical components 130a-130h disposed over surface 122 with bumps 114, terminals 134, or other electrical interconnect of the electrical components extending at least partially into substrate 120 to contact bump stop layer 128. In particular, FIG. 4 shows further detail of exemplary electric component 130a having bumps 114 embedded into penetrable film layer 132 to contact bump stop layer 128. Bumps 114 of electric component 130a extend at least partially into substrate 120, as defined in FIG. 3c, to contact bump stop layer 128.

In FIG. 2d, an encapsulant or molding compound 138 is deposited over and around components 130a-130h and substrate 120 using a paste printing, compressive molding, transfer molding, liquid encapsulant molding, vacuum lamination, spin coating, or other suitable applicator. Encapsulant 138 can be polymer composite material, such as epoxy resin with filler, epoxy acrylate with filler, or polymer with proper filler. Encapsulant 138 is non-conductive, provides structural support, and environmentally protects the semiconductor device from external elements and contaminants.

In FIG. 2e, channel 140 is cut into surface 141 of encapsulant 138 using saw blade or laser cutting tool 142. Channel 140 extends completely through encapsulant 138 and partially but not completely through substrate 120. Channel 140 extends at least past bump stop layer 128. The remaining thickness of substrate 120 is T1 about 100 μm.

Figure 2F:
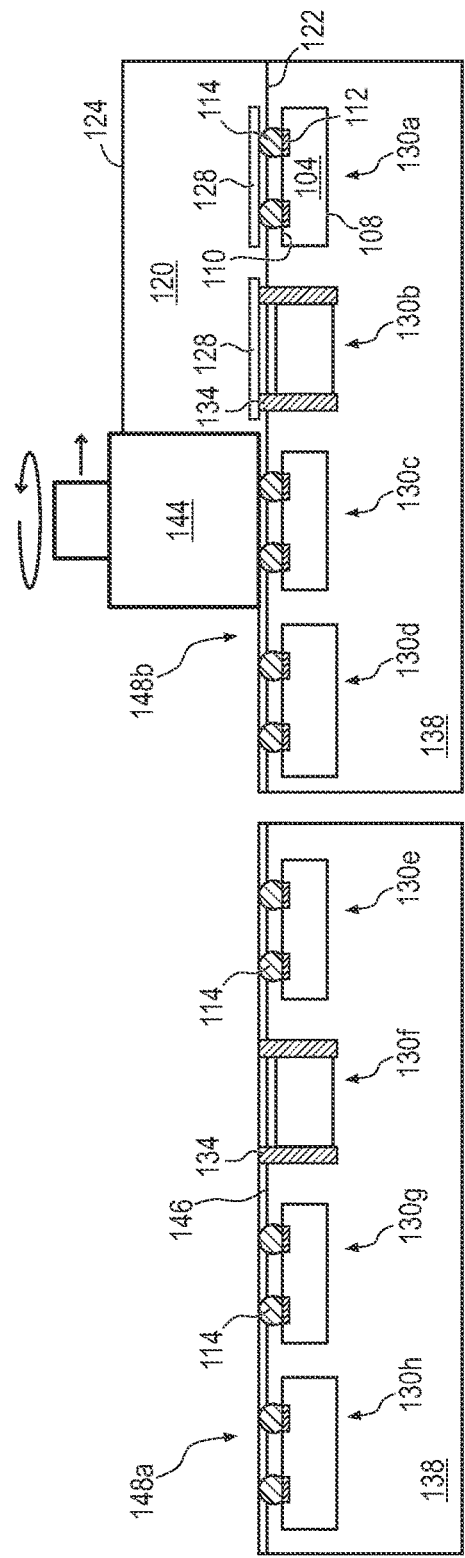

In FIG. 2f, sacrificial substrate 120, including bump stop layer 128, is removed by grinder 144 down to bumps 114 and terminals 134 of electrical components 130a-130h. Grinder 144 may operate tilted at an angle with respect to surface 146. Alternatively, substrate 120 is removed by chemical etching, chemical mechanical polishing (CMP), mechanical peel-off, mechanical grinding, thermal bake, ultra-violet (UV) light, laser scanning, or wet stripping to expose bumps 114 and terminals 134 of electrical components 130a-130h. The grinding operation completes the singulation of substrate 120 into SiP modules 148a and 148b.

Figure 2G:
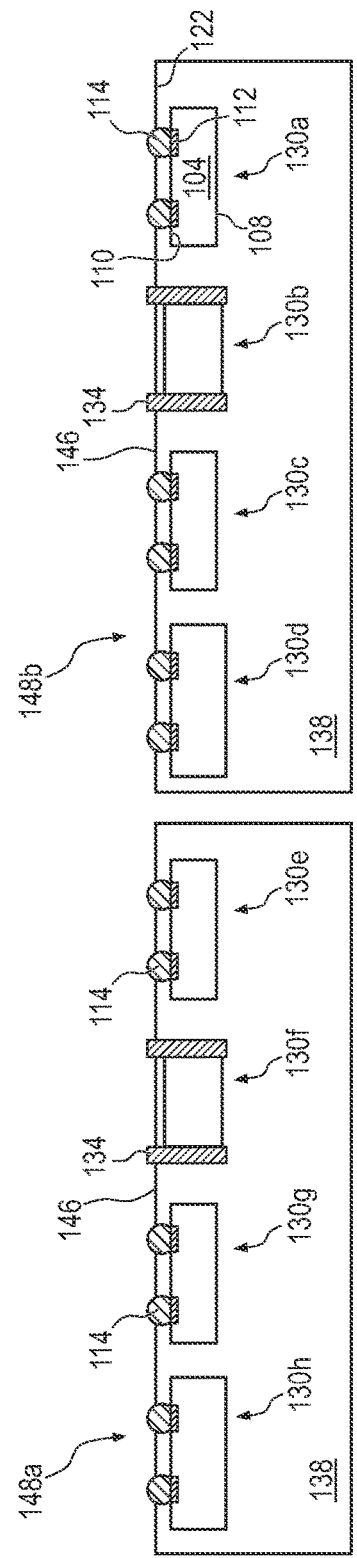

In FIG. 2g, the remaining portion of substrate 120, post grinding, is removed by an etching process so that bumps 114 and terminals 134 extend out from surface 146 of encapsulant 138. At least a portion of bumps 114 and terminals 134 extends out from encapsulant 138 beyond surface 146.

Figure 2H:
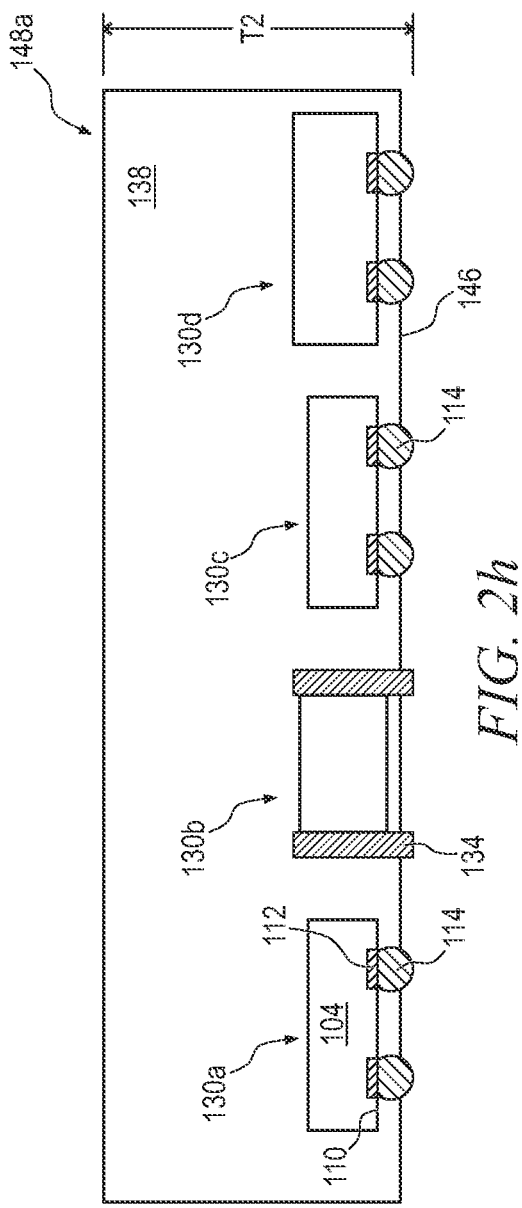
Figure 5:
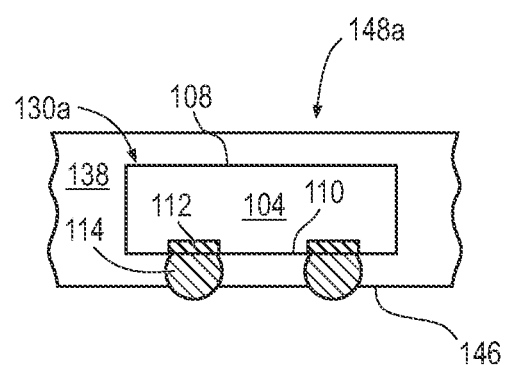
FIG. 5 illustrates the bumps of the electrical component extending out from the encapsulant.

FIG. 2h shows SiP module 148a post-grinding with bumps 114 and terminals 134 of electrical components 130a-130d extending from encapsulant 138. Bumps 114 and terminals 134 of electrical components 130a-130d extend out from surface 146 of encapsulant 138 by nature of the bumps and terminals having been at least partially embedded within substrate 120 and then the substrate removed to expose the bumps and terminals. FIG. 5 shows further detail of exemplary circuit components 130a with bumps 114 extending from encapsulant 138. Bumps 114 extend out from surface 146 of encapsulant 138 by nature of the bumps having been at least partially embedded within substrate 120, as shown in FIG. 4, and then the substrate removed to expose the bumps. The same is true of SiP module 148b containing electrical components 130e-130h. Bumps 114 and terminals 134 of electrical components 130e-130h extend out from surface 146 of encapsulant 138 by nature of the bumps and terminals having been at least partially embedded within substrate 120 and then the substrate removed to expose the bumps and terminals.

Removing substrate 120 and leaving bumps 114 and terminals 134 of electrical components 130a-130h extending from encapsulant 138 reduces the thickness of SiP modules 148a and 148b, as compared to SiP modules having a substrate. The thickness of SiP modules 148a and 148b become the thickness T2 of encapsulant 138 and the exposed bumps 114 and terminals 134. In one embodiment, the thickness of SiP modules 148a and 148b may be T2 about 640 µm. SiP modules 148a and 148b have reduced thickness by eliminating substrate 120. SiP modules 148a and 148b are absent substrate 120.

Figure 2I:
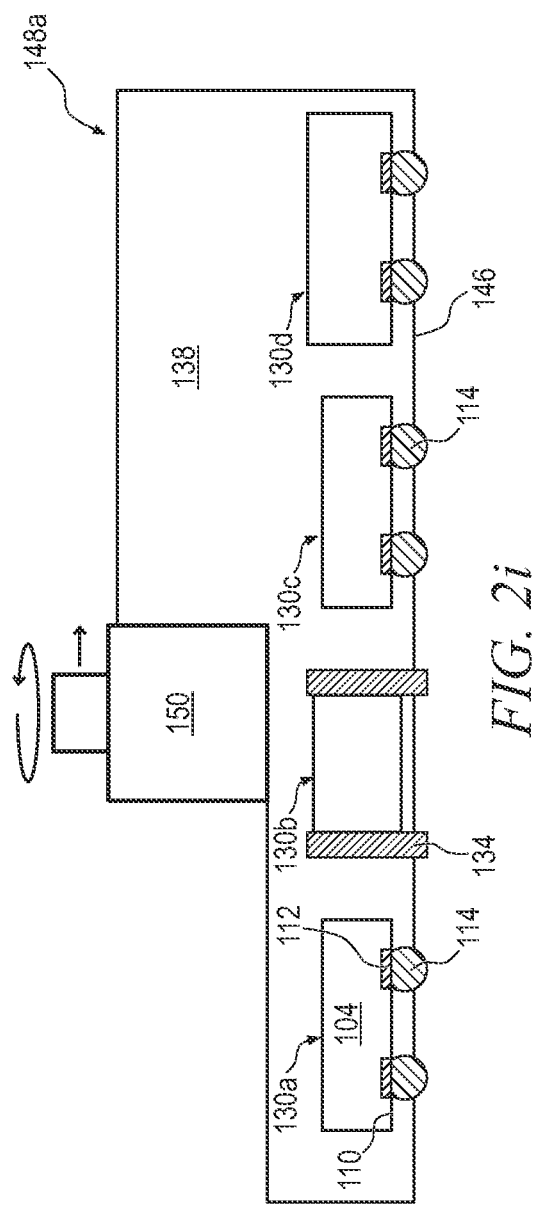

In FIG. 2i, a portion of encapsulant 138 is optionally removed by grinder 150 to further reduce the thickness of SiP module 148a. In the case of FIG. 2j, the thickness of SiP modules 148a and 148b may be T3 about 340 µm.

In FIG. 2k, a solder paste 156 can be deposited over the exposed bumps 114 and terminals 134.

Figure 6A:
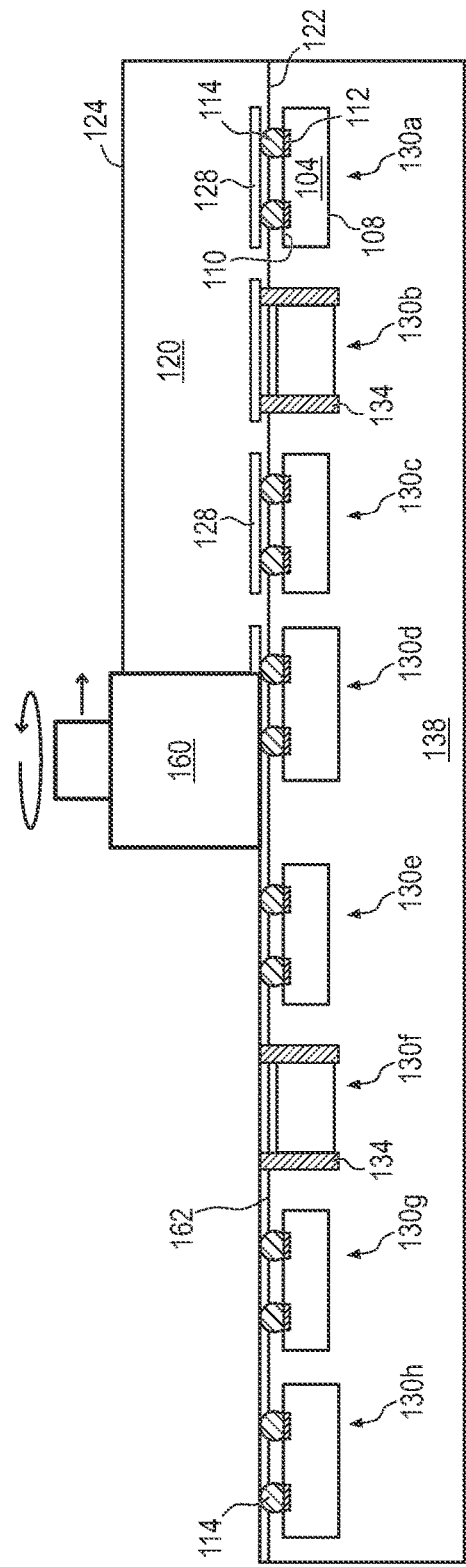
FIGS. 6a-6d illustrate another process of forming an SiP module absent a substrate.

In another embodiment, continuing from FIG. 2d, substrate 120, including bump stop layer 128, is removed by grinder 160 down to bumps 114 and terminals 134 of electrical components 130a-130h, as shown in FIG. 6a. Grinder 160 may operate tilted at an angle with respect to surface 162. Alternatively, substrate 120 is removed by chemical etching, CMP, mechanical peel-off, mechanical grinding, thermal bake, UV light, laser scanning, or wet stripping to expose bumps 114 and terminals 134 of electrical components 130a-130h.

Figure 6B:
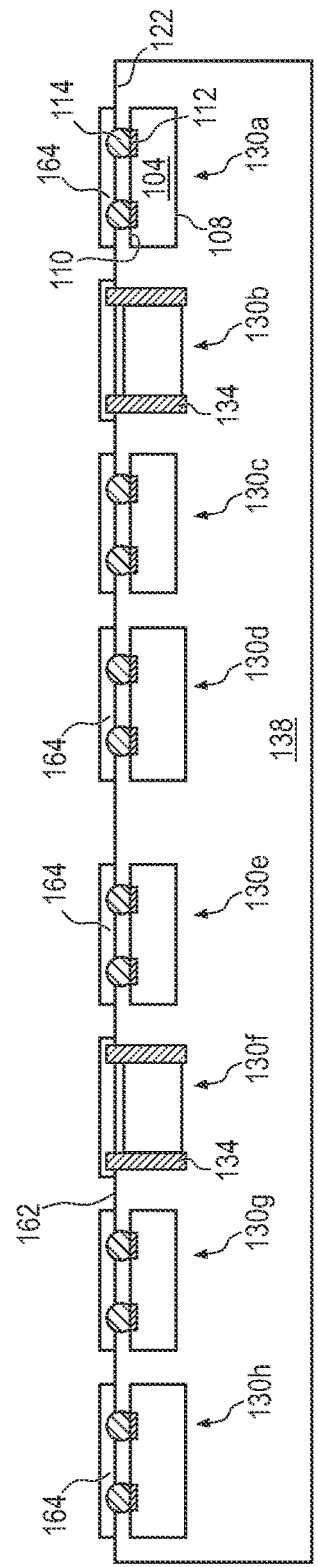

The remaining portion of substrate 120, post grinding, is removed by an etching process so that bumps 114 and terminals 134 extend out from surface 162. At least a portion of bumps 114 and terminals 134 extends out from encapsulant 138 beyond surface 162. FIG. 6b shows bumps 114 and terminals 134 of electrical components 130a-130h extending from encapsulant 138, post grinding. Solder paste 164 can be deposited over the exposed bumps 114 and terminals 134.

Figure 6C:
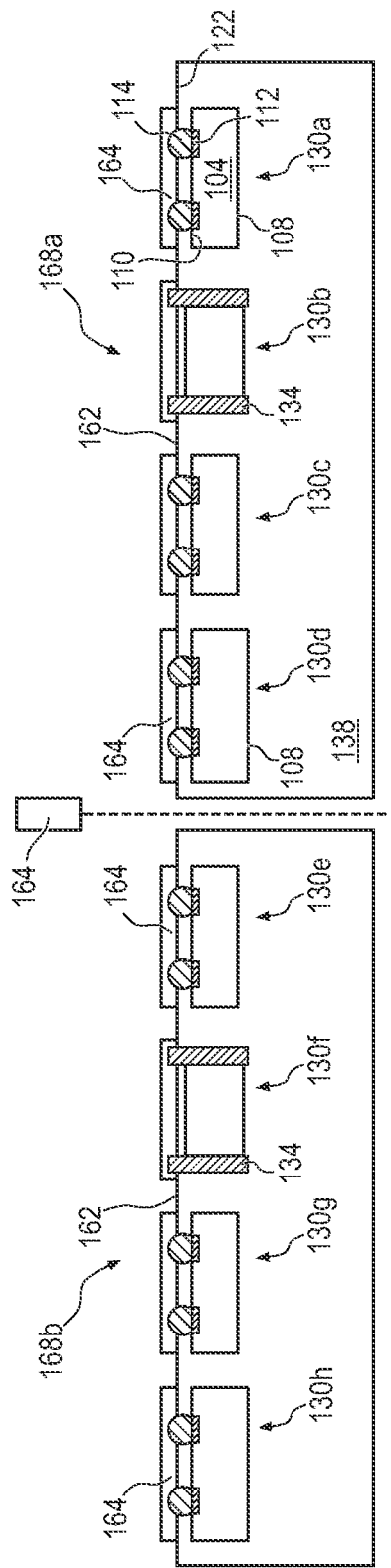

In FIG. 6c, encapsulant 138 is singulated using saw blade or laser cutting tool 166. SiP module 168a includes electrical components 130a-130d with bumps 114 and terminals 134 extending out beyond surface 162 of encapsulant 138. SiP module 168b includes electrical components 130e-130h with bumps 114 and terminals 134 extending out beyond surface 162 of encapsulant 138.

Figure 6D:
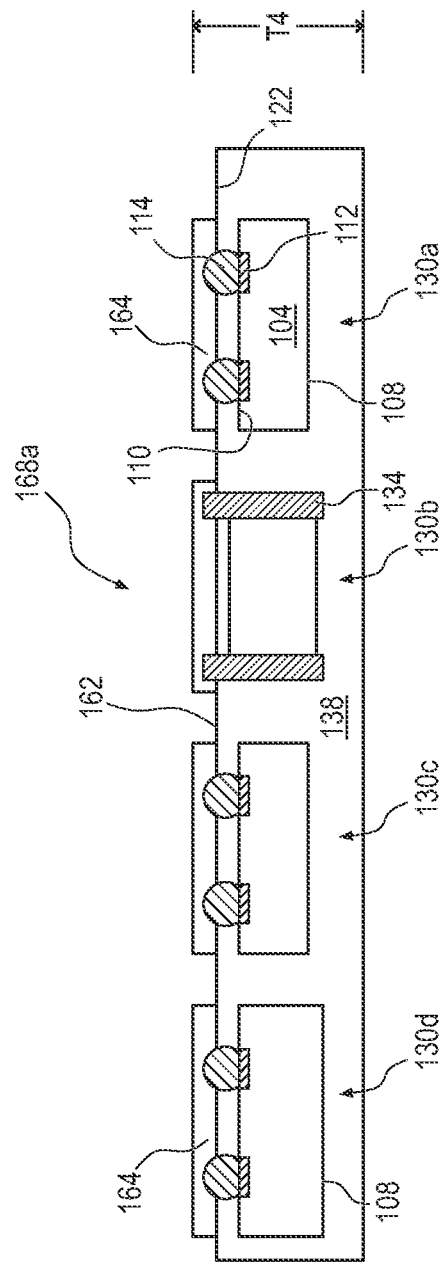

FIG. 6d shows SiP module 168a post-grinding with bumps 114 and terminals 134 of electrical components 130a-130d extending out beyond surface 162 of encapsulant 138. Bumps 114 and terminals 134 of electrical components 130a-130d extend out from surface 162 of encapsulant 138 by nature of the bumps and terminals having been at least partially embedded within substrate 120 and then the substrate removed to expose the bumps and terminals. FIG. 5 shows further detail of exemplary circuit components 130a with bumps 114 extending from encapsulant 138. Bumps 114 extend out from surface 162 of encapsulant 138 by nature of the bumps having been at least partially embedded within substrate 120, as shown in FIG. 4, and then the substrate removed to expose the bumps. The same is true of SiP module 168b containing electrical components 130e-130h. Bumps 114 and terminals 134 of electrical components 130e-130h extend out from surface 162 of encapsulant 138 by nature of the bumps and terminals having been at least partially embedded within substrate 120 and then the substrate removed to expose the bumps and terminals.

Removing substrate 120 and leaving bumps 114 and terminals 134 of electrical components 130a-130h extending out beyond surface 162 of encapsulant 138 reduces the thickness of SiP modules 168a and 168b, as compared to SiP modules having a substrate. The thickness of SiP modules 168a and 168b become the thickness T4 of encapsulant 138 and the exposed bumps 114 and terminals 134. In one embodiment, the thickness of SiP modules 168a and 168b may be T4 about 325 µm. SiP modules 168a and 168b have reduced thickness by eliminating substrate 120. SiP modules 168a and 168b are absent substrate 120.

Figure 7A:
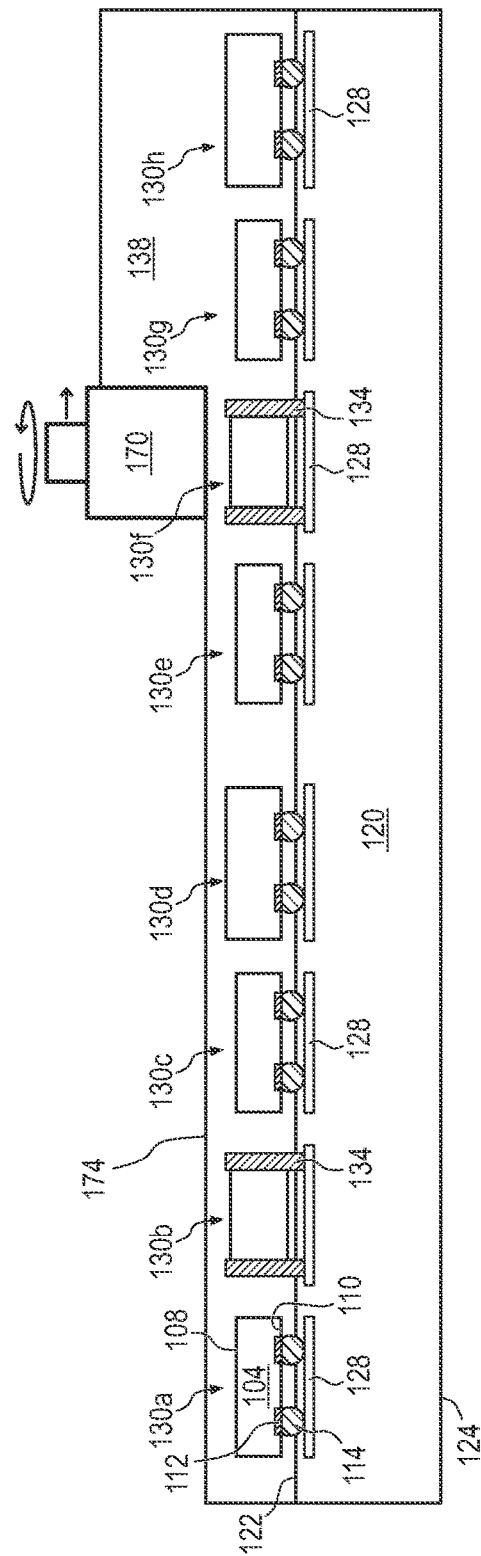
FIGS. 7a-7e illustrate another process of forming an SiP module absent a substrate.

In another embodiment, continuing from FIG. 2d, a portion of encapsulant 138 is removed by grinder 170 to reduce the thickness of the encapsulant, as shown in FIG. 7a.

Figure 7B:
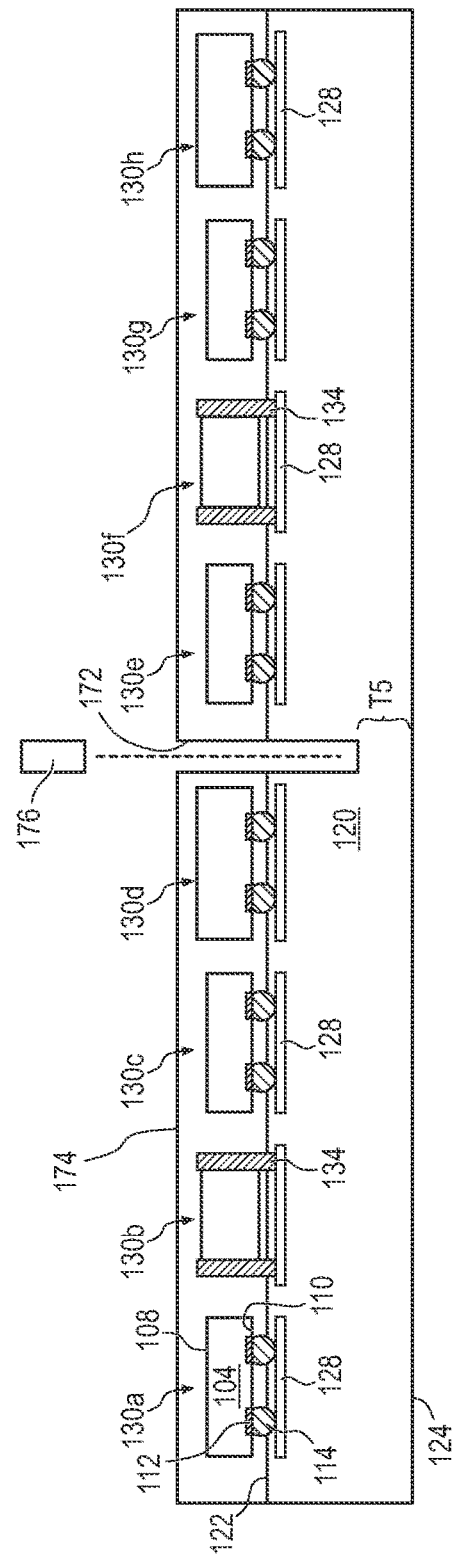

In FIG. 7b, channel 172 is cut into surface 174 of encapsulant 138 using saw blade or laser cutting tool 176. Channel 172 extends completely through encapsulant 138 and partially but not completely through substrate 120. Channel 172 extends at least past bump stop layer 128. The remaining thickness of substrate 120 is T5 about 200 µm.

Figure 7C:
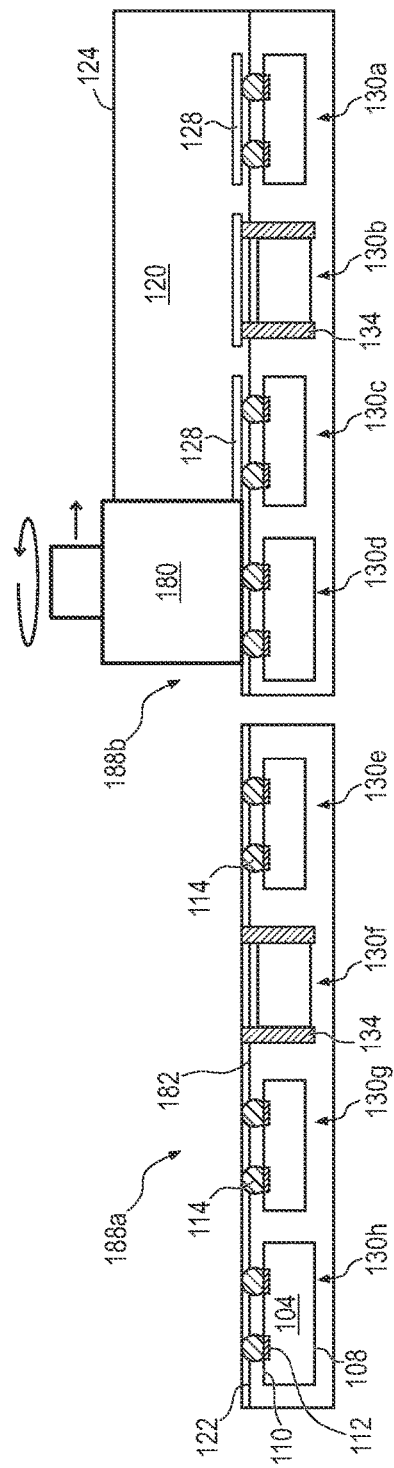

In FIG. 7c, substrate 120, including bump stop layer 128, is removed by grinder 180 to expose bumps 114 and terminals 134 of electrical components 130a-130h. Grinder 180 may operate tilted at an angle with respect to surface 182. Alternatively, substrate 120 is removed by chemical etching, CMP, mechanical peel-off, mechanical grinding, thermal bake, UV light, laser scanning, or wet stripping to expose bumps 114 and terminals 134 of electrical components 130a-130h. The grinding operation completes the singulation of substrate 120 into SiP modules 188a and 188b.

Figure 7D:
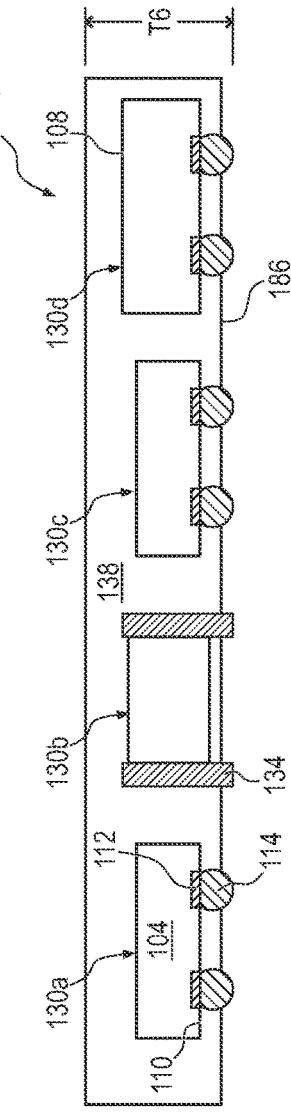

The remaining portion of substrate 120, post grinding, is removed by an etching process so that bumps 114 and terminals 134 extend out from surface 174. At least a portion of bumps 114 and terminals 134 extends out from encapsulant 138 beyond surface 174. FIG. 7d shows SiP module 188a post-grinding with bumps 114 and terminals 134 of electrical components 130a-130d extending out beyond surface 174 of encapsulant 138. Bumps 114 and terminals 134 of electrical components 130a-130d extend out from surface 174 of encapsulant 138 by nature of the bumps and terminals having been at least partially embedded within substrate 120 and then the substrate removed to expose the bumps and terminals. FIG. 5 shows further detail of exemplary circuit components 130a with bumps 114 extending from encapsulant 138. Bumps 114 extend out from surface 174 of encapsulant 138 by nature of the bumps having been at least partially embedded within substrate 120, as shown in FIG. 4, and then the substrate removed to expose the bumps. The same is true of SiP module 188b containing electrical components 130e-130h. Bumps 114 and terminals 134 of electrical components 130e-130h extend out from surface 174 of encapsulant 138 by nature of the bumps and terminals having been at least partially embedded within substrate 120 and then the substrate removed to expose the bumps and terminals.

Removing substrate 120 and leaving bumps 114 and terminals 134 of electrical components 130a-130h extending out from encapsulant 138 reduces the thickness of SiP modules 188a and 188b, as compared to SiP modules having a substrate. The thickness of SiP modules 188a and 188b become the thickness T6 of encapsulant 138 and the exposed bumps 114 and terminals 134. In one embodiment, the thickness of SiP modules 188a and 188b may be T6 about 340 µm. SiP modules 188a and 188b have reduced thickness by eliminating substrate 120. SiP modules 188a and 188b are absent substrate 120.

Figure 7E:
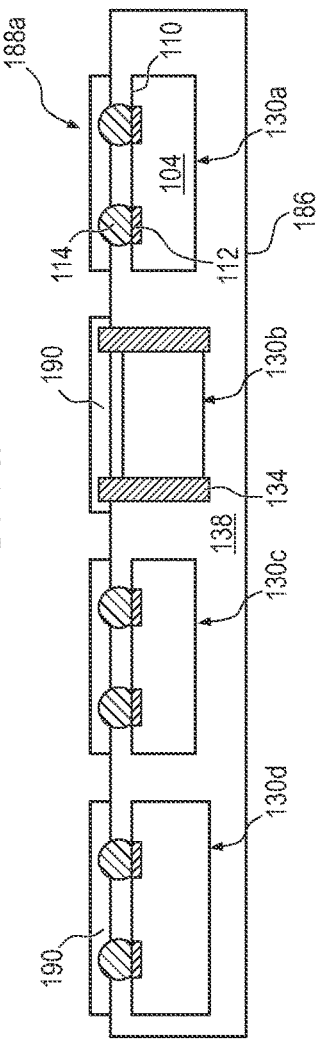

In FIG. 7e, a solder paste 190 can be deposited over the exposed bumps 114 and terminals 134.

In another embodiment, continuing from FIG. 2e, sacrificial substrate 120, including bump stop layer 128, is removed by grinder 144 down to surface 146 of encapsulant 138, as shown in FIG. 8a. Grinder 144 may operate tilted at an angle with respect to surface 146. Alternatively, substrate 120 is removed by chemical etching, CMP, mechanical peel-off, mechanical grinding, thermal bake, UV light, laser scanning, or wet stripping to expose bumps 114 and terminals 134 of electrical components 130a-130h. The grinding operation completes the singulation of substrate 120 into SiP modules 148a and 148b, as shown in FIG. 8b.

Figure 8C:
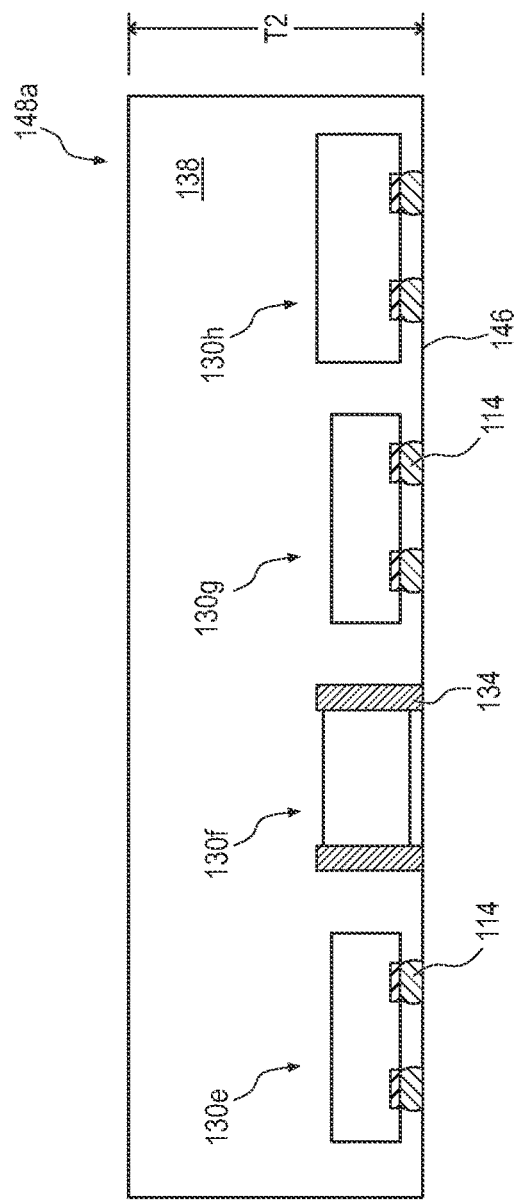

FIG. 8c shows SiP module 148a post-grinding with bumps 114 and terminals 134 of electrical components 130a-130d coplanar with and exposed from surface 146 of encapsulant 138.

Figure 8D:
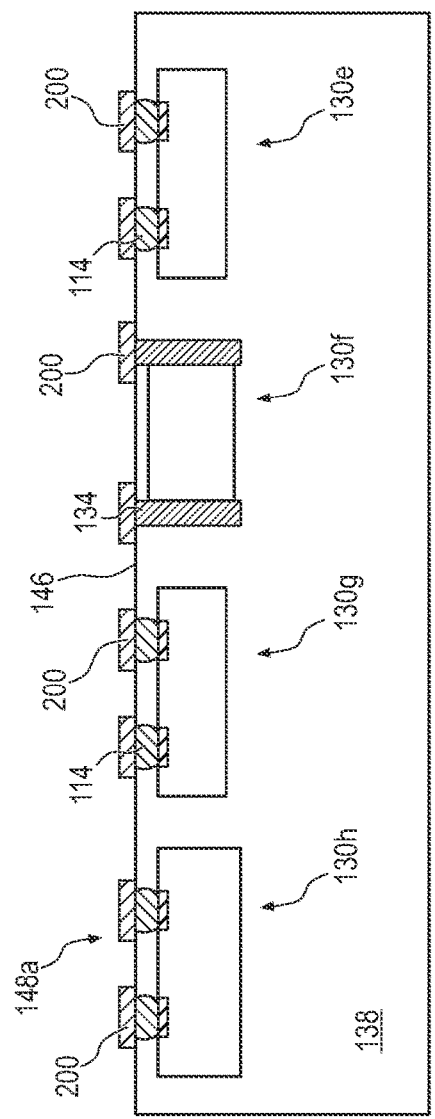

A portion of encapsulant 138 can be removed by grinder 150 to further reduce the thickness of SiP module 148a, similar to FIG. 2i. In FIG. 8d, solder paste 200 can be deposited over the exposed bumps 114 and terminals 134 using a printing process. Solder paste 200 is reflowed to reform bumps 114 and terminals 134 extending out from encapsulant 138, as shown in FIG. 8e.

In another embodiment, a cross-sectional view of sacrificial substrate or carrier 120 including top major surface 122 and bottom major surface 124, as shown in FIG. 9a. A bump stop layer 128 is embedded within substrate 120, below surface 122, see FIGS. 3a-3c. A portion of substrate 120 is removed by an etching or LDA process to form openings 210 extending down to bump stop layer 128. The location of openings 210 corresponds to bumps 114 and terminals 134.

In FIG. 9b, a plurality of electrical components 130a-130h is mounted to substrate 120 with bumps 114 and terminals aligned with openings 210 and extending below surface 122 down to contact bump stop layer 128 to form SiP module 220, similar to FIGS. 2b-2c.

FIG. 9c shows electrical components 130a-130h disposed over surface 122 with bumps 114, terminals 134, or other electrical interconnect of the electrical components extending at least partially below surface 122 to contact bump stop layer 128. The processing of SiP module 220 continues similar to FIGS. 2e-2k.

Figure 10:
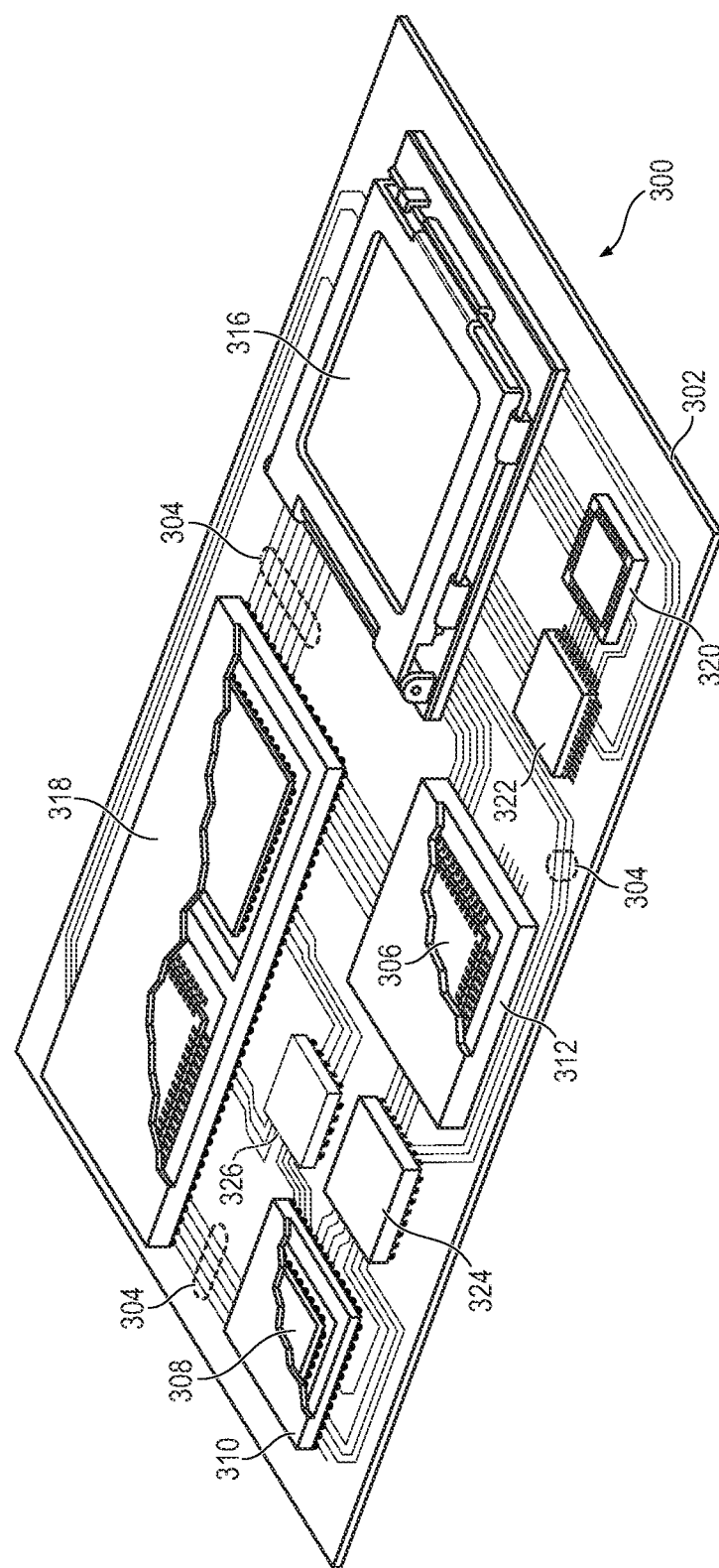
FIG. 10 illustrates a printed circuit board (PCB) with different types of packages mounted to a surface of the PCB.

FIG. 10 illustrates electronic device 300 having a chip carrier substrate or PCB 302 with a plurality of semiconductor packages mounted on a surface of PCB 302, including SiP modules 148a, 148b, 168a, 168b, 188a, 188b. Electronic device 300 can have one type of semiconductor package, or multiple types of semiconductor packages, depending on the application.

Electronic device 300 can be a stand-alone system that uses the semiconductor packages to perform one or more electrical functions. Alternatively, electronic device 300 can be a subcomponent of a larger system. For example, electronic device 300 can be part of a tablet, cellular phone, digital camera, communication system, or other electronic device. Alternatively, electronic device 300 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 10, PCB 302 provides a general substrate for structural support and electrical interconnect of the semiconductor packages mounted on the PCB. Conductive signal traces 304 are formed over a surface or within layers of PCB 302 using evaporation, electrolytic plating, electroless plating, screen printing, or other suitable metal deposition process. Signal traces 304 provide for electrical communication between each of the semiconductor packages, mounted components, and other external system components. Traces 304 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB. For the purpose of illustration, several types of first level packaging, including bond wire package 306 and flipchip 308, are shown on PCB 302. Additionally, several types of second level packaging, including ball grid array (BGA) 310, bump chip carrier (BCC) 312, land grid array (LGA) 316, multi-chip module (MCM) or SiP module 318, quad flat non-leaded package (QFN) 320, quad flat package 322, embedded wafer level ball grid array (eWLB) 324, and wafer level chip scale package (WLCSP) 326 are shown mounted on PCB 302. In one embodiment, eWLB 324 is a fan-out wafer level package (Fo-WLP) and WLCSP 326 is a fan-in wafer level package (Fi-WLP). Depending upon the system requirements, any combination of semiconductor packages, configured with any combination of first and second level packaging styles, as well as other electronic components, can be connected to PCB 302. In some embodiments, electronic device 300 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a sacrificial substrate including a bump stop layer;
    disposing an electrical component over the sacrificial substrate with a bump of the electrical component penetrating the sacrificial substrate and stopping the penetration by contacting the bump stop layer;
    depositing an encapsulant over the electrical component and sacrificial substrate; and
    removing the sacrificial substrate to leave the bump of the electrical component extending out from the encapsulant.

2. The method of claim 1, further including forming the bump stop layer within the sacrificial substrate.

3. The method of claim 1, further including embedding at least a portion of the bump of the electrical component into the sacrificial substrate.

4. The method of claim 1, further including forming a channel through the encapsulant and partially into the sacrificial substrate.

5. The method of claim 1, wherein a thickness of the semiconductor device is determined by a thickness of the encapsulant and bump extending out from the encapsulant.

6. The method of claim 1, further including removing a portion of the encapsulant.

7. The method of claim 1, further including:
    forming the bump stop layer over the sacrificial substrate; and
    forming a penetrable layer over the bump stop layer and sacrificial substrate.

8. A method of making a semiconductor device, comprising:
    providing a substrate including a stop layer;
    disposing an electrical component over the substrate with a terminal of the electrical component at least partially embedded in the substrate and contacting the stop layer;
    depositing an encapsulant over the electrical component and substrate; and
    removing the substrate to leave the terminal of the electrical component exposed from the encapsulant.

9. The method of claim 8, further including forming the stop layer within the substrate.

10. The method of claim 8, further including:
    forming the stop layer over the substrate; and
    forming a penetrable layer over the stop layer and substrate.

11. The method of claim 8, further including forming a channel through the encapsulant and partially into the substrate.

12. The method of claim 8, wherein a thickness of the semiconductor device is determined by a thickness of the encapsulant and terminal.

13. The method of claim 8, further including removing a portion of the encapsulant.

14. The method of claim 8, further including depositing a conductive paste over the terminal exposed from the encapsulant.

15. A method of making a semiconductor device, comprising:
    providing a substrate including a stop layer;
    disposing an electrical component over the substrate with a terminal of the electrical component penetrating the substrate and contacting the stop layer;
    depositing an encapsulant over the electrical component and substrate; and
    removing the substrate to leave a terminal of the electrical component extending out from the encapsulant.

16. The method of claim 15, further including forming the stop layer within the substrate.

17. The method of claim 15, further including:
    forming the stop layer over the substrate; and
    forming a penetrable layer over the stop layer and substrate.

18. The method of claim 15, further including forming a channel through the encapsulant and partially into the substrate.

19. The method of claim 15, wherein a thickness of the semiconductor device is determined by a thickness of the encapsulant and terminal extending out from the encapsulant.

20. The method of claim 15, further including removing a portion of the encapsulant.

21. The method of claim 15, wherein the electrical component includes a semiconductor die or a discrete semiconductor device.

22. A method of making a semiconductor device, comprising:
    providing a substrate including a stop layer;
    providing an electrical component with a terminal of the electrical component penetrating the substrate and contacting the stop layer;
    depositing an encapsulant over the electrical component and substrate; and
    removing the substrate to leave a terminal of the electrical component extending out from the encapsulant, wherein a thickness of the semiconductor device is determined by a thickness of the encapsulant and the terminal extending out from the encapsulant.

23. The method of claim 22, further including depositing the encapsulant over a plurality of electrical components.

24. The method of claim 22, further including forming a channel through the encapsulant.

25. The method of claim 22, further including depositing a conductive paste over the terminal.

26. The method of claim 22, wherein the electrical component includes a semiconductor die or a discrete semiconductor device.

27. The method of claim 22, further including forming the stop layer within the substrate.

28. The method of claim 22, further including:
    forming the stop layer over the substrate; and
    forming a penetrable layer over the stop layer and substrate.

* * * * *